United States Patent [19]

Thomas, III et al.

[11] Patent Number: 5,057,185
[45] Date of Patent: Oct. 15, 1991

[54] TRIODE PLASMA REACTOR WITH PHASE MODULATED PLASMA CONTROL

[75] Inventors: John Henry Thomas, III, Holland, Pa.; Bawa Singh, Voorhees, N.J.

[73] Assignee: Consortium for Surface Processing, Inc., Princeton, N.J.

[21] Appl. No.: 589,401

[22] Filed: Sep. 27, 1990

[51] Int. Cl.⁵ .................. H01L 21/306; B44C 1/22; B05D 3/06; C23C 14/00

[52] U.S. Cl. ...................... 156/643; 118/050.1; 118/620; 118/728; 156/646; 156/345; 204/298.06; 204/298.34

[58] Field of Search ............ 118/728, 50.1, 620; 427/38, 39; 156/643, 646, 657, 662, 345; 204/192.32, 192.37, 298.06, 298.08, 298.34

[56] References Cited

U.S. PATENT DOCUMENTS

| | | | |
|---|---|---|---|
| 4,464,223 | 8/1984 | Gorin | 156/643 |
| 4,572,759 | 2/1986 | Benzing | 156/345 |
| 4,585,516 | 4/1986 | Corn et al. | 156/643 |
| 4,786,359 | 11/1988 | Stark et al. | 156/643 |
| 4,863,549 | 9/1989 | Grünwald | 156/345 |
| 4,963,242 | 10/1990 | Sato et al. | 204/298.31 |

*Primary Examiner*—William A. Powell
*Attorney, Agent, or Firm*—Bell, Seltzer, Park & Gibson

[57] ABSTRACT

A triode plasma reactor having first, second and third electrodes for forming a plasma in a reaction chamber from a reactant gas includes a phase modulated potential generator for generating time varying potentials on the second and third electrodes which are phase modulated versions of one another. The phase modulated versions may also include a fixed phase shift between them. By time varying the phase angle relative to a set phase shift, a new dimension of time varying control for the reactor may be obtained. Phase modulation at frequencies from audio frequencies to radio frequencies may be provided. Phase modulation may be accomplished digitally or in the analogue domain.

25 Claims, 3 Drawing Sheets

TRIODE PLASMA REACTOR WITH PHASE MODULATED PLASMA CONTROL

FIELD OF THE INVENTION

This invention relates to plasma reactor systems for processing samples such as semiconductor substrates, and more particularly to a plasma reactor having three electrodes for generating plasma.

BACKGROUND OF THE INVENTION

Plasma processing techniques are widely used for etching or depositing thin films on, or surface modification of, samples such as semiconductor substrates. As the density of semiconductor devices increases, plasma processing is being increasingly utilized because it can deposit films at lower temperatures than conventional techniques, can deposit a more conformal film and can also deposit and etch films in situ.

Recently, a number of triode plasma reactors have been designed. A typical triode plasma reactor, also referred to as a trielectrode plasma reactor, includes a reaction chamber for containing the sample to be processed and inlet and outlet ports for introducing a reactant into the chamber. Three electrodes are used to generate plasma in the chamber from the reactant.

Typically, the first electrode is a wall or other surface of the reaction chamber and is typically connected to ground potential, a floating potential or other fixed reference potential. The second and third electrodes are typically contained within the chamber and are electrically isolated from the chamber wall and from each other. Often one electrode is connected under or adjacent the sample holder and the other electrode is located above the sample holder, although many other configurations exist. At least one of the second or third electrodes is typically excited by a radio frequency (RF) voltage source, often at 13.56 MHz. An RF source may also excite the other electrode. Alternatively, often a low frequency or medium frequency source is used to excite the other electrode. Permanent or electromagnets are often provided in order to produce a magnetic field within the chamber to enhance plasma formation.

Many techniques have been devised for enhancing the performance of triode plasma reactors. For example, U.S. Pat. No. 4,464,223 to Gorin entitled *Plasma Reactor Apparatus and Method* describes a triode plasma reactor in which the first electrode is grounded, the second electrode is powered at a high frequency of about 13.56 MHz and the third electrode is powered by a low frequency of about 100 KHz. Because ions cannot respond to the main excitation frequency (13.56 MHz) the average ion energy impacting the sample surface is controlled by the lower frequency (100 KHz) voltage. At 100 KHz ions can transit the dark space region in response to the RF voltage applied. Unfortunately, the low frequency excitation also generates its own sheath voltage and DC bias and also interacts with the generation of reactive species, thereby limiting the performance of this design.

Another attempt to improve the operation of a triode plasma reactor is described in U.S. Pat. No. 4,585,516 to Corn et al. entitled *Variable Duty Cycle, Multiple Frequency, Plasma Reactor*. In the Corn et al. patent, the triode plasma reactor includes a grounded first electrode, a second electrode driven by a high frequency signal and a third electrode driven by a low frequency signal. A control apparatus is also provided to modulate the duty cycle of one or more of the signals so that the duty cycles of the signals overlap. In other words, the amplitude of the two voltage sources is modulated so that at least one of the signals has a duty cycle of less than 100%.

Another attempt to improve trielectrode plasma reactor performance is described in U.S. Pat. No. 4,863,549 to Grünwald entitled *Apparatus for Coating or Etching by Means of a Plasma*. In the Grünwald patent, the first electrode is grounded, the second electrode is connected to a high frequency RF signal generator and the third electrode is connected to a medium frequency RF generator. The medium frequency voltage consists of unipolar pulses that have the same amplitude for a predeterminable time interval. The number of ions impinging on the sample is thereby decoupled from the amplitude of the applied medium frequency voltage. This may contribute to the generation of undesirable reactive species.

Yet another attempt at providing an improved triode plasma reactor is described in U.S. Pat. No. 4,572,759 to Benzing entitled *Triode Plasma Reactor with Magnetic Enhancement*. In this patent, the first electrode is grounded and the second electrode is connected to a high frequency RF oscillator. The second electrode is connected to the high frequency oscillator through a variable phase delay. The phase of the RF power delivered to the third electrode relative to the second electrode may be adjusted by the variable phase delay from $-180°$ to $+180°$. The optimum phase relationship depends upon the frequency of the RF energy chosen, the geometry of the chamber and the pressure and the nature of the gases used. When the optimum phase relationship between the wafer stage and the cathode is utilized, the processing rate is enhanced.

Notwithstanding the above improvements, there is still a need in the art for improved triode plasma reactors. In particular, for a given triode plasma reactor configuration there is a need to provide electrical parameters, other than frequency, amplitude, duty cycle, and phase lag between the two electrodes, which can be controlled to enhance the performance of the plasma reactor. A new dimension of control is needed to control the rate, selectivity and ion damage independent of the reactive species formation, to vary the ion current while maintaining the ion energy constant, and to provide uniform processing of a substrate which moves in the chamber during processing.

SUMMARY OF THE INVENTION

It is therefore an object of the invention to provide an improved triode plasma reactor.

It is another object of the invention to provide a triode plasma reactor which provides a new dimension of electrical control over plasma processing.

These and other objects are provided according to the present invention by a triode plasma reactor in which the first electrode is connected to a first potential and the second and third electrodes are connected to a phase modulated potential generating means. The phase modulated potential generating means generates second and third time varying potentials on the second and third electrodes respectively, with the third potential being a phase modulated version of the second potential. In other words, the phase angle of the third potential varies over time, relative to the phase angle of the second potential. This time varying phase modulation provides an added dimension for controlling the triode plasma reactor.

In a preferred embodiment of the present invention, the phase modulated potential generating means is a phase shift modulated potential generating means, so that the third potential is a phase modulated version of a phase shifted version of the second potential. Stated another way, the second and third potentials differ from one another by a fixed phase angle, which may be set to optimize the plasma processing. Moreover, the second and third potentials also differ in that the phase difference between the second and third potentials is modulated about the set phase angle. The phase shift modulation provides a new dimension of control for the plasma processing process.

According to the invention, the phase difference between the signals applied to the second and third electrodes is varied over time about a particular set point. The set point may be a zero degree phase difference, or any other phase difference between $-180°$ and $+180°$. Phase modulation about this set point takes place over a range of modulation frequencies from audio frequencies to radio frequencies. By modulating the phase, a new variable may be created to allow enhanced control of triode plasma reaction by creating dynamic (time varying) plasma processing conditions. For example, an optimum phase difference may be chosen to minimize ion damage, and this can be modulated to fine tune the ion current and plasma uniformity at the substrate surface.

The phase modulated potential generating means of the present invention may be embodied in a number of ways. For example, the second potential applied to the second electrode may be derived from a sine wave oscillator, for example a 13.56 MHz oscillator. A phase shift modulator may also be coupled to the sine wave oscillator. The phase shift modulator may be responsive to a fixed signal and to a time varying signal. The fixed signal applies a set phase shift to the signal from the sinusoidal oscillator. The time varying signal produces a phase modulation about the fixed phase shift to thereby derive the phase modulated version of the phase shifted signal from the sine wave oscillator.

Alternatively, one output from the sine wave oscillator may be phase shifted by a fixed phase shift to provide the second voltage to the second electrode. Another output of the sine wave oscillator may be phase modulated to provide a phase modulated version of the sine wave oscillator signal to the third electrode.

In yet another alternative, a pair of sine wave oscillators may be provided, with one oscillator being phase shift modulated and the other applied directly. Alternatively, the output of one oscillator may be phase shifted and the other oscillator may be phase modulated. Preferably, the oscillators are synchronized to one another using a phase lock loop or other well known means. Many other alternatives are possible for phase modulating one potential relative to the other.

The phase modulating or phase shift modulating function may be obtained using standard components such as an Armstrong modulator. Phase shifting and phase modulation may be accomplished digitally as well as in the analogue domain.

Another embodiment of the present invention provides a triode plasma reactor with a plurality of second electrodes and a corresponding plurality of phase modulated potential generators. A controller may apply a separate phase shift and phase modulation signal to each generator in order to independently control the phase shift and phase modulation of the potentials applied to each of the second electrodes. This multiple modulator, multiple electrode configuration may be particularly useful for plasma processing of substrates which move relative to the electrodes during processing. In this case, phase modulation may be coordinated with the substrate movement to provide uniform plasma processing notwithstanding substrate movement.

The phase modulation of the present invention creates a time varying dynamic flow of the plasma which can be used to fine tune the plasma process. Also, it may allow the energy of the plasma to be controlled independently of the reactive species formation thereby allowing rate, selectivity and substrate damage to be controlled independent of the reactive species formation. Independent adjustment of phase angle and phase modulation may be provided, so that phase angle may be used to optimize the process and phase modulation adjustment may be used to provide a new dimension of process control. In addition, this dynamic variation may result in being able to create and sustain plasma species or other plasma conditions on a time average basis.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1A:
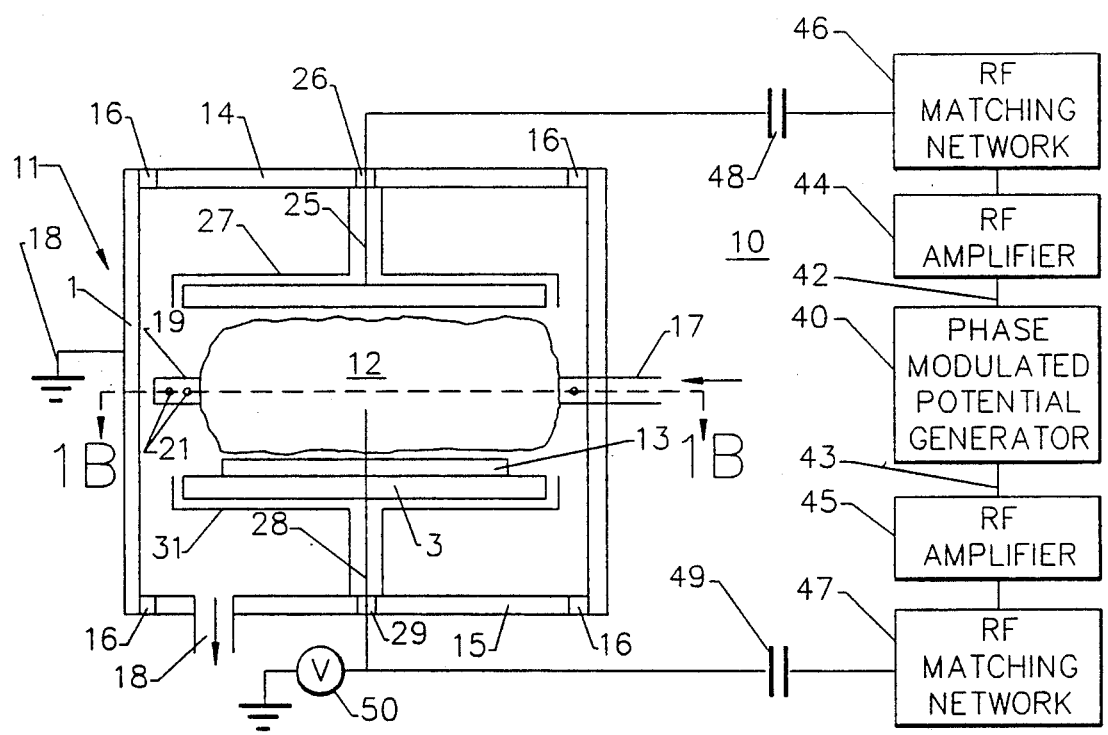
FIGS. 1A and 1B are schematic diagrams of a triode plasma reactor according to the present invention.
Figure 1B:
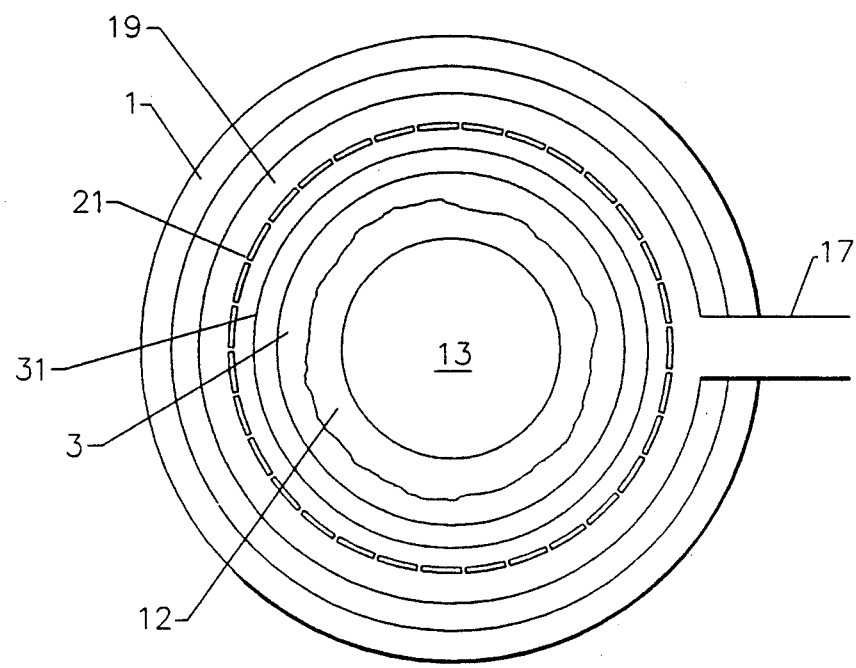

Referring now to FIG. 1, a first embodiment of a triode plasma reactor according to the present invention will now be described. As shown in FIG. 1, the triode plasma reactor 10 includes a reaction chamber 11 which contains the sample 13 to be processed, typically a semiconductor substrate. Gas inlet port 17 introduces a reactant gas into the chamber and exhaust port 18 exhausts the spent reactants from the chamber. In the embodiment shown in FIG. 1, a cylindrical chamber is illustrated. The cylindrical chamber includes a circular gas distribution tube 19 having a plurality of outlet ports 21 therein for uniformly distributing the gas near sample 13.

The chamber also includes a first electrode, second electrode and third electrode, 1, 2 and 3 respectively, for forming a plasma 12 in the chamber from the reactant gas introduced through inlet port 17.

As shown in FIG. 1, first electrode 1 is connected to a first potential 18 which is typically a fixed reference potential, here ground potential. However it will be understood by those having skill in the art that other reference potentials can be used. As shown in FIG. 1, first electrode 1 is the wall of the reaction chamber 11. In some embodiments, the ceiling 14 and floor 15 of the reaction chamber 11 may be isolated from wall 1 by insulators 16. In other configurations the wall 1, ceiling 14 and floor 15 are all electrically connected together to form the first electrode.

The second electrode 2 may be a disk-shaped electrode as shown, or may be an elongated electrode, which is mounted in the chamber using a mounting post 25 or other means and which is insulated from the first electrode 1 by insulator 26. A shield 27 may also be provided around the first electrode.

The third electrode 3, which may be disk-shaped, elongated or of other shapes, may also function as a holder for the sample 13. The third electrode 3 may be mounted in the chamber on mounting post 28, and if necessary may be insulated from the chamber floor 15 by insulator 29. A shield 31 may also be provided.

It will be understood by those having skill in the art that the design details of the chamber 11 including the first, second and third electrodes 1, 2, and 3 respectively, will vary from one triode plasma reactor to another and need not be described further herein. It will also be understood by those having skill in the art that the designation and positioning of the second and third electrodes 2 and 3 is arbitrary and that they may be placed at other locations or their locations may be reversed.

Still referring to FIG. 1, a phase modulated potential generator 40 generates a second and third time varying potential on lines 42 and 43 respectively, which potentials are applied to second electrode 2 and third electrode 3, respectively. The second time varying potential on line 42 may be coupled to the second electrode 2 via an RF amplifier 44 and an RF matching network 46 and a capacitor 48 if necessary. Accordingly, the second time varying potential is generated on the second electrode 2. Similarly, as also illustrated in FIG. 1, the third time varying potential is applied to third electrode 3 via RF amplifier 45, RF matching network 47 and capacitor 49 if necessary. The design of RF amplifiers 44 and 45, RF matching networks 46 and 47, and capacitors 48 and 49 are well known to those having skill in the art and need not be described further. In some configurations, a fixed voltage source 50 may also be connected to the third electrode 3.

According to the present invention, the phase modulated potential generator generates the second and third time varying potentials on lines 42 and 43 respectively, with the third potential being a phase modulated version of the second potential. Preferably, the third potential is a phase modulated version of a phase shifted version of the second potential; i.e. a phase shift modulated version of the second potential. Stated mathematically, if the second potential V₂ is represented by the arbitrary time varying function f(t), then the third potential may be represented by:

$$V_3 = f(t + \phi + f_m(t)).$$

Accordingly, the present invention allows a fixed phase angle $\phi$ to be set and also provides phase modulation at a modulation frequency $f_m$ to be independently set. The phase shift $\phi$ may be set to optimize the process while the phase modulation $f_m(t)$ may be set to add a new dimension of control.

Often, the functions involved are sinusoidal, although it will be understood by those having skill in the art that other types of wave forms may be used. When the second voltage V₂ is represented by cos(ft), then the third voltage may be represented by:

$$V_3 = \cos(ft + \phi + \sin f_m(t)).$$

Phase modulated potential generator 40 may be designed in many ways using standard off-the-shelf components. However, for the sake of completeness three embodiments of phase modulated potential generator 40 will be described in connection with FIGS. 2, 3 and 4.

Figure 2:
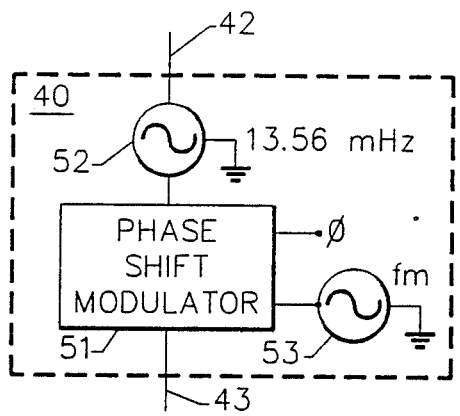
FIG. 2 is a schematic block diagram of a first embodiment of a phase modulated potential generator which may be used with the system of FIG. 1.

Referring now to FIG. 2, the first embodiment of the phase modulated potential generator 40 uses a 13.56 MHz sine wave generator 52 to generate the second potential on line 42. The output of the sine wave generator 52 is also coupled to a phase shift modulator 51 which, for example, may be a well-known Armstrong phase shift modulator which is responsive to a fixed voltage $\phi$ for setting the fixed phase shift and is responsible to a modulating frequency 53 for setting the phase modulation $f_m(t)$.

Figure 3:
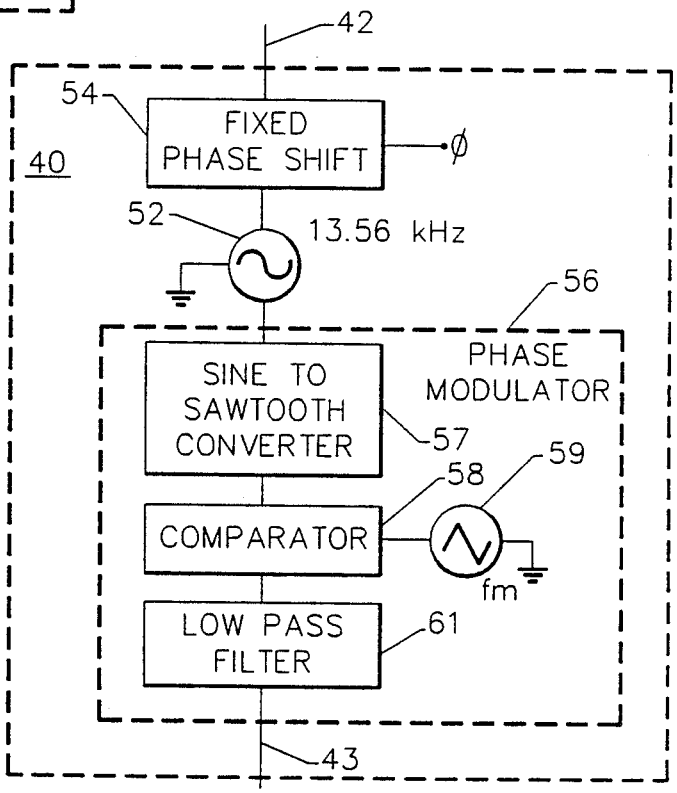
FIG. 3 is a schematic block diagram of a second embodiment of a phase modulated potential generator which may be used with the system of FIG. 1.

Referring now to FIG. 3, a second embodiment of phase modulated potential generator 40 is shown. In this embodiment, one output of sine wave generator 52 is phase shifted and another output of sine wave generator 52 is phase modulated. Accordingly, sine wave generator 52 is coupled to both a fixed phase shifter 54 and a phase modulator 56. Moreover, in this embodiment phase modulator 56 operates digitally. The digitally operating phase modulator may be provided by a sine-to-sawtooth converter 57 which converts the output of sine wave generator 52 to a sawtooth wave. A sawtooth wave generator 59 applies a sawtooth wave having the desired modulation frequency $f_m$. A comparator compares the output of the converter 57 and sawtooth generator 59. The digital output of comparator 58 is applied to a low-pass filter or tuned circuit to reconvert to the analog domain and the output of low pass filter 61 is applied to line 43. Accordingly, phase modulation may be performed digitally.

Figure 4:
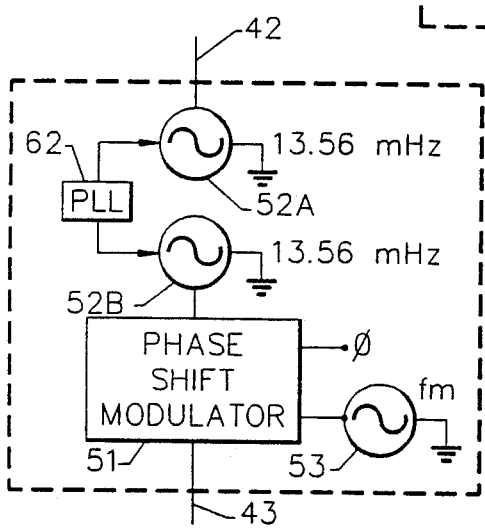
FIG. 4 is a schematic block diagram of a third embodiment of a phase modulated potential generator which may be used with the system of FIG. 1.

Yet another embodiment is shown in FIG. 4. In this embodiment, a pair of sine wave generators 52A and 52B are used, with the sine wave generators being synchronized by a phase locked loop 62 or other well-known synchronizing means. The output of sine wave generator 52A is applied to line 42 and the output of the sine wave generator 52B is applied to a phase shift modulator 51 as already described.

It will be understood by those having skill in the art that many other configurations for phase modulated potential generator 40 may be provided and that the embodiments of FIGS. 2, 3 and 4 and are merely illustrative.

Figure 5:
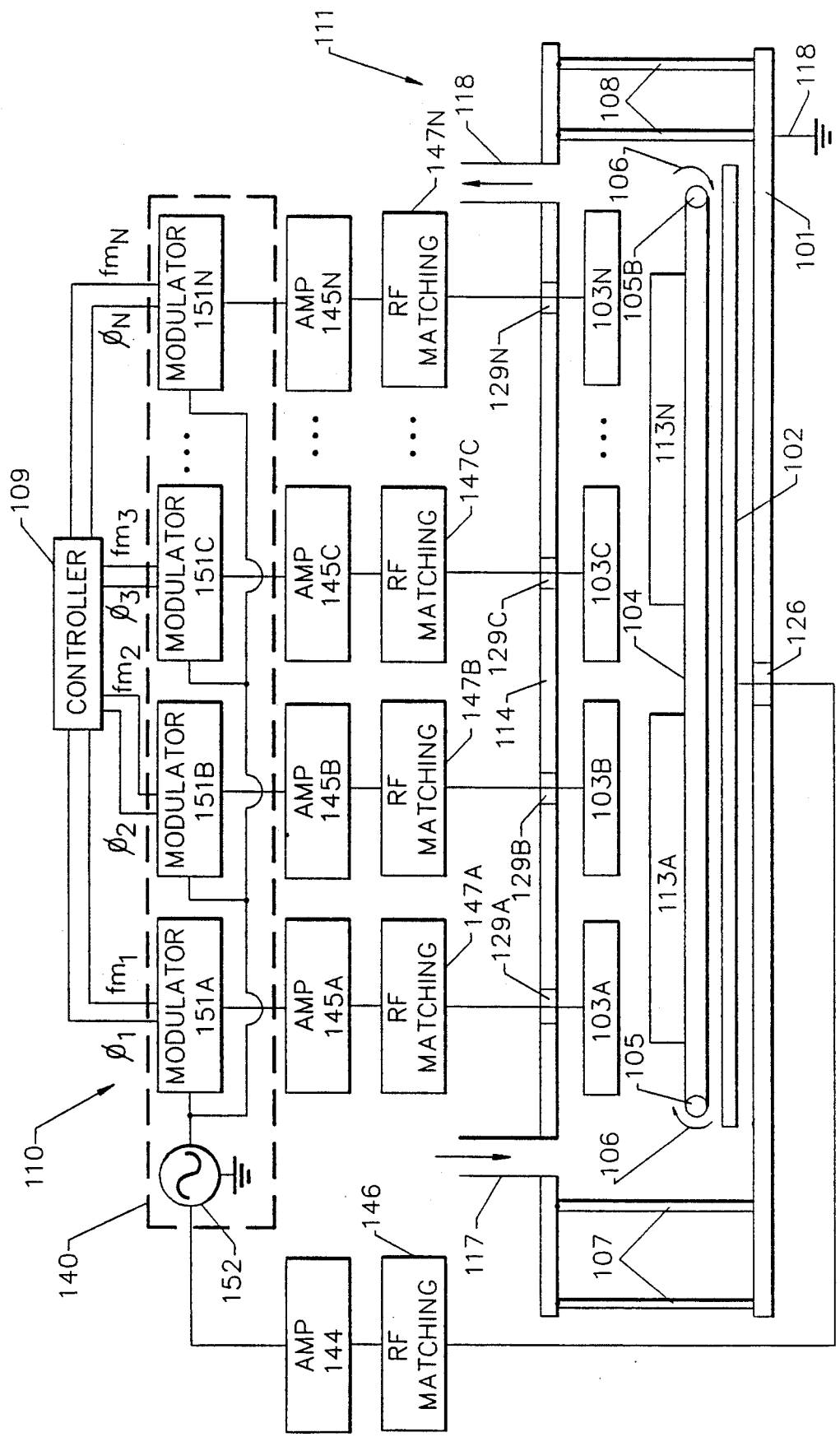
FIG. 5 is a schematic diagram of a second embodiment of a triode plasma reactor according to the present invention.

Referring now to FIG. 5, a second embodiment of a triode plasma reactor according to the present invention will now be described. In FIG. 5, an in-line triode plasma reactor 110 includes a chamber 111 with a plurality of third electrodes 103A ... 103N. A plurality of phase shift modulators 151A ... 151N apply independent phase shifts $\phi_1 ... \phi_n$ and phase modulations $f_{m1} ... f_m$, under control of a controller 109. It will also be understood by those having skill in the art that a single modulator may be coupled to a plurality of delay lines to provide independently controlled phase shifts.

In particular, the chamber 111 includes a first electrode 101 which may be the floor of the chamber and which is coupled to a first fixed potential 118. The second electrode 102 is isolated from the first electrode 101 by insulator 126. Inlet port 117 and exhaust port 118 are provided. Within the chamber 111, a conveyor 104 driven by a pair of rollers 105A and 105B move the substrates 113A ... 113N from the left to the right in the direction shown by arrows 106. An entry load lock 107 and an exit load lock 108 permit placement and removal respectively of wafers 113 from the chamber 111. Accordingly, a high throughput system is provided. The detailed design of such a multiple target reactor system is well known to those having skill in the art and will not be described further.

As described above, a plurality of third electrodes 103A ... 103N are provided in the chamber. A respective modulator 151A ... 151N is coupled to a respective third electrode 103A ... 103N via amplifiers 145A ... 145N and RF matching networks 147A ... 147N if necessary. The phase modulated potential generator 140 corresponds to the embodiment shown in FIG. 2 except that multiple phase shift modulators 151A ... 151N are used. The sine Wave generator 152 is connected to the second electrode 102 Via amplifier 144 and RF matching network 146 through oscillator 126. The sine wave generator 152 is also connected to each of modulators 151A ... 151N. As shown, controller 109 supplies independent phase shift signals $\phi_1 ... 100_n$ and phase modulation signals $f_{m1} ... f_{mn}$ to modulators 151A ... 151N. It will also be understood that the phase modulated potential generator 140 may be connected to a plurality of first or second electrodes.

According to the invention, the phase modulation which is applied to electrodes 103A ... 103N may be coordinated with movement of the samples 113A ... 113N through chamber 111 in order to compensate for the movement of the substrate in the multi-target system. Uniform processing of the moving substrates may thereby be obtained. Since the modulation frequencies $f_{m1} ... f_{mn}$ may compensate for the movement of substrates 113, a low frequency modulation is preferably used. In any event, the phase modulation provides an independent dimension of control in a trielectrode plasma processing system.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A plasma reactor for processing a sample comprising:
   a reaction chamber for containing a sample;
   means for introducing a reactant into said chamber;
   first, second and third electrodes for forming a plasma in said chamber from the reactant introduced into said chamber, said first electrode being connected to a first potential; and
   phase modulated potential generating means for generating second and third time varying potentials on said second and third electrodes, respectively, said third potential being a phase modulated version of said second potential.

2. The plasma reactor of claim 1 wherein said phase modulated potential generating means comprises a phase shift modulated potential generating means, said third potential being a phase modulated version of a phase shifted version of said second potential.

3. The plasma reactor of claim 1 wherein said phase modulated potential generating means comprises:
   time varying potential generating means, for generating said second time varying potential on said second electrode; and
   phase modulating means, electrically connected to said time varying potential generating means, for generating said phase modulated version of said second time varying potential on said third electrode.

4. The plasma reactor of claim 2 wherein said phase shift modulated potential generating means comprises:
   time varying potential generating means for generating said second time varying potential on said second electrode; and
   phase shift modulating means, electrically connected to said time varying potential generating means, for generating said phase modulated version of a phase shifted version of said second time varying potential on said third electrode.

5. The plasma reactor of claim 2 wherein said phase shift modulated potential generating means comprises:
   means for generating a fourth time varying potential;
   phase shifting means, electrically connected to said fourth time varying potential generating means, for generating a phase shifted version of said fourth time varying potential on said third electrode; and
   phase modulating means, electrically connected to said fourth time varying potential generating means, for generating a phase modulated version of said fourth time varying potential on fourth electrode.

6. The plasma reactor of claim 1 wherein said phase modulated potential generating means is responsive to a time varying signal for generating said phase modulated version of said second potential.

7. The plasma reactor of claim 2 wherein said phase shift modulated potential generating means is responsive to a fixed signal for generating the phase shifted version of said second potential, and is responsive to a time varying signal for generating the phase modulated version of the phase shifted version of said second potential.

8. The plasma reactor of claim 1 wherein said reaction chamber includes a wall, wherein said first electrode comprises at least part of the wall of the reaction chamber, wherein said second electrode is mounted in said reaction chamber and electrically insulated therefrom, and wherein said third electrode is mounted inside said reaction chamber and electrically insulated therefrom and from said first electrode.

9. The plasma reactor of claim 3 wherein said time varying potential generating means comprises a sinusoidal oscillator.

10. The plasma reactor of claim 9 wherein said sinusoidal oscillator comprises a radio frequency sinusoidal oscillator.

11. The plasma reactor of claim 4 wherein said time varying potential generating means comprises a sinusoidal oscillator.

12. The plasma reactor of claim 11 wherein said sinusoidal oscillator comprises a radio frequency sinusoidal oscillator.

13. The plasma reactor of claim 3 wherein said time varying potential generating means comprises first and second time varying potential generating means, said first time varying potential means being electrically connected to said second electrode, and said second time varying potential generating means being electrically connected to said phase modulating means.

14. The plasma reactor of claim 13 wherein said first and second time varying potential generating means are synchronized to one another.

15. The plasma reactor of claim 4 wherein said time varying potential generating means comprises first and second time varying potential generating means, said first time varying potential generating means being electrically connected to said second electrode, and said second time varying potential generating means being electrically connected to said phase modulating means.

16. The plasma reactor of claim 15 wherein said first and second time varying potential generating means are synchronized to one another.

17. The plasma reactor of claim 1 further comprising means for generating a magnetic field in said reaction chamber.

18. The plasma reactor of claim 1 wherein said third electrode comprises a plurality of third electrodes and wherein said phase modulated potential generating means generates a second time varying potential on said second electrode and a respective one of a plurality of third time varying potentials on a respective one of said plurality of third electrodes, each of said third time varying potentials being a phase modulated version of said second potential.

19. The plasma reactor of claim 18 further comprising a controller, electrically connected to said phase modulated potential generating means, for independently controlling the phase modulation of each of said third time varying potentials.

20. A method of processing a sample in a plasma reactor including first and second electrodes in a reaction chamber, comprising the steps of:
introducing a reactant into the reaction chamber;
generating first and second time varying potentials, with the second time varying potential being a phase modulated version of the first time varying potential;
applying the first time varying potential to the first electrode; and
applying the second time varying potential to the second electrode.

21. The method of claim 20 wherein said generating step comprises the step of:
generating first and second time varying potentials, with the second time varying potential being a phase shift modulated version of the first time varying potential.

22. The method of claim 20 wherein said generating step comprises the steps of:
generating the first time varying potential; and
phase modulating the first time varying potential to generate the second time varying potential.

23. The method of claim 21 wherein said generating step comprises the steps of:
generating the first time varying potential;
shifting the phase of the first time varying potential by a predetermined phase shift; and
modulating the phase shifted time varying potential to generate the second time varying potential.

24. The method of claim 21 wherein said generating step comprises the steps of:
generating a third time varying potential;
shifting the phase of the third time varying potential by a predetermined phase shift to generate the first time varying potential; and
phase modulating the third time varying potential to generate the second time varying potential.

25. The method of claim 20 adapted for use with a plasma reactor including a plurality of second electrodes; wherein said generating step comprises the step of generating a first and a plurality of second time varying potentials, with each of the second time varying potentials being a phase modulated version of the first time varying potential; and wherein the second applying step comprises the step of applying a respective one of the second time varying potentials to a respective one of the second electrodes.

* * * * *

UNITED STATES PATENT AND TRADEMARK OFFICE
CERTIFICATE OF CORRECTION

PATENT NO. : 5,057,185

DATED : October 15, 1991

INVENTOR(S) : Thomas, III et al.

It is certified that error appears in the above-identified patent and that said Letters Patent is hereby corrected as shown below:

Column 7, line 28 "Via" should be --via--

Column 7, line 32 "$100_n$" should be --$\phi_n$--

Signed and Sealed this

Second Day of March, 1993

Attest:

STEPHEN G. KUNIN

*Attesting Officer*   Acting Commissioner of Patents and Trademarks